US007445654B2

(12) United States Patent
Wong

(10) Patent No.: US 7,445,654 B2
(45) Date of Patent: Nov. 4, 2008

(54) METHOD AND APPARATUS FOR ADSORBING MOLECULES FROM AN ATMOSPHERE INSIDE AN ENCLOSURE CONTAINING MULTIPLE DATA STORAGE DEVICES

(75) Inventor: Walter Wong, Boulder, CO (US)

(73) Assignee: Spectra Logic Corporation, Denver, CO (US)

( * ) Notice: Subject to any disclaimer, the term of this patent is extended or adjusted under 35 U.S.C. 154(b) by 404 days.

(21) Appl. No.: 10/951,321

(22) Filed: Sep. 27, 2004

(65) Prior Publication Data

US 2006/0064953 A1    Mar. 30, 2006

(51) Int. Cl.
*B01D 46/00* (2006.01)
(52) U.S. Cl. .................... 55/385.6; 55/385.1; 55/385.2; 55/418; 55/471; 96/147; 96/148; 454/187; 454/192; 206/710; 206/711; 360/97.02; 720/654
(58) Field of Classification Search ................ 55/385.6, 55/385.1, 385.2, 418, 471; 454/187, 192; 206/710, 711; 360/97.02; 720/654; 96/147, 96/148

See application file for complete search history.

(56) References Cited

U.S. PATENT DOCUMENTS

| | | | | |
|---|---|---|---|---|
| 4,642,715 A | * | 2/1987 | Ende | 360/97.02 |
| 4,831,475 A | * | 5/1989 | Kakuda et al. | 360/97.03 |
| 5,030,260 A | | 7/1991 | Beck et al. | |
| 5,293,286 A | * | 3/1994 | Hasegawa et al. | 360/97.02 |
| 5,485,446 A | * | 1/1996 | Uno et al. | 720/654 |
| 5,619,486 A | * | 4/1997 | Uno et al. | 720/654 |
| 6,088,660 A | * | 7/2000 | Uno et al. | 702/130 |
| 6,128,159 A | | 10/2000 | Ino | |
| 6,309,437 B1 | * | 10/2001 | Jones | 55/385.1 |
| 6,356,407 B1 | | 3/2002 | Slezak | |
| 6,544,309 B1 | * | 4/2003 | Hoefer et al. | 55/283 |
| 6,758,876 B2 | * | 7/2004 | Suzuki et al. | 55/385.6 |
| 6,767,379 B2 | * | 7/2004 | Jones | 55/385.6 |
| 2002/0134239 A1 | | 9/2002 | Tang et al. | |
| 2003/0231424 A1 | | 12/2003 | Hong et al. | |
| 2004/0105187 A1 | | 6/2004 | Woodruff et al. | |
| 2004/0223253 A1 | | 11/2004 | Woodruff et al. | |
| 2004/0264037 A1 | | 12/2004 | Downey et al. | |

(Continued)

FOREIGN PATENT DOCUMENTS

EP    1168352 A    2/2002

(Continued)

OTHER PUBLICATIONS

U.S. Appl. No. 10/950,613, Starr et al.

(Continued)

*Primary Examiner*—Duane Smith
*Assistant Examiner*—Minh-Chau T. Pham

(57) ABSTRACT

Disclosed is a method and apparatus for a storage system having an adsorbtive element capable of adsorbing gas home molecules from gas for the storage system. In one configuration the storage system can include an enclosure adapted to contain a plurality of data storage drive devices and data storage media and wherein the data storage drive devices are adapted to functionally operate. The enclosure is capable of containing gas having, among other constituents, gas borne molecules. The storage system is capable of cooperating with the adsorbtive element to adsorb gas borne molecules from the gas for inside of the enclosure

20 Claims, 11 Drawing Sheets

U.S. PATENT DOCUMENTS

| | | |
|---|---|---|
| 2004/0264038 A1 | 12/2004 | Heineman et al. |
| 2004/0264039 A1 | 12/2004 | Armagost et al. |
| 2004/0264040 A1 | 12/2004 | Armagost et al. |
| 2004/0264041 A1 | 12/2004 | Kumpon et al. |
| 2004/0264042 A1 | 12/2004 | Pollard et al. |
| 2005/0007692 A1 | 1/2005 | Thompson et al. |
| 2005/0047258 A1 | 3/2005 | Starr et al. |
| 2005/0057847 A1 | 3/2005 | Armagost et al. |
| 2005/0063089 A1 | 3/2005 | Starr et al. |
| 2005/0065637 A1 | 3/2005 | Lantry et al. |
| 2005/0185323 A1 | 8/2005 | Brace et al. |
| 2005/0195517 A1 | 9/2005 | Brace et al. |
| 2005/0195518 A1 | 9/2005 | Starr et al. |
| 2005/0195519 A1 | 9/2005 | Kumpon et al. |
| 2005/0195520 A1 | 9/2005 | Starr et al. |
| 2005/0219964 A1 | 10/2005 | Pollard et al. |
| 2005/0246484 A1 | 11/2005 | Lantry et al. |
| 2005/0267627 A1 | 12/2005 | Lantry et al. |

FOREIGN PATENT DOCUMENTS

| | | |
|---|---|---|
| WO | WO 2005/010661 A2 | 2/2005 |
| WO | PCT/US05/45168 | 6/2006 |
| WO | PCT/US05/46447 | 6/2006 |

OTHER PUBLICATIONS

U.S. Appl. No. 10/980,594, Fenske et al.
U.S. Appl. No. 11/011,812, Starr et al.
U.S. Appl. No. 11/019,911, Curtis et al.
U.S. Appl. No. 11/037,985, Permut et al.
U.S. Appl. No. 11/040,937, Starr et al.
U.S. Appl. No. 11/089,749, Starr et al.
U.S. Appl. No. 11/123,725, Rector et al.
U.S. Appl. No. 11/126,025, Rector et al.
U.S. Appl. No. 11/145,768, Downey et al.
U.S. Appl. No. 11/230,146, Starr et al.
U.S. Appl. No. 11/240,893, Starr et al.
U.S. Appl. No. 11/264,920, Lantry et al.

* cited by examiner

METHOD AND APPARATUS FOR ADSORBING MOLECULES FROM AN ATMOSPHERE INSIDE AN ENCLOSURE CONTAINING MULTIPLE DATA STORAGE DEVICES

CROSS-REFERENCE TO RELATED APPLICATIONS

None.

FIELD OF THE INVENTION

The present invention relates generally to adsorption of molecules from an atmosphere inside of an enclosure, such as of the type which typically contains multiple data storage devices.

BACKGROUND

Storage technology has been on an aggressive memory capacity growth curve while storage components have conversely become smaller. This technology development has been made possible by stretching the limits of known physical properties in materials with introductions of material innovations and the arrangement thereof. Spacing between heads and media, bit sizes on media, protective films covering components, just to name a few, have all been refined to nanoscale dimensions. As this minimization effect continues, components are becoming more and more susceptible to contamination effects due to typical environmental molecular and super-molecular contaminants, such as dust, moisture, pollutants, and manufacturing and operational by-products. Even with advances in manufacturing technology (such as so-called "clean rooms") and advances in HVAC systems, such contaminants still manage to make their way into sensitive data storage systems.

Adsorbers are a class of materials that can be solid or liquid and can hold molecules or ions of another substance on its surface. Generally speaking, adsorbers attract and hold molecular layers of gaseous molecules (i.e., molecules suspended, dissolved, or otherwise carried in a gas) by Van der Waal attractive forces. These gaseous molecules can be from the family of acid gasses such as $NiO_x$, $HNO_x$, $HCl$, $SO_x$, etc., hydrocarbons and even water vapor, just to name a few. Examples of adsorbers include activated carbon, of which there are many arrangements, silica-gel, alumina, and a variety of other materials capable of attracting and retaining target molecules generally having high surface to volume ratios.

Adsorbers have been used by the disc drive industry to a limited extent and in a specific manner. Contained and sealed within a disc drive, adsorbers have been used to take advantage of air flow generated by the spinning motion of the disc moving potentially contaminated air over the adsorber. This air flow can help filter out airborne contaminants generated from out gassing components initially installed within the disc drive. Nonetheless, due to the expense of absorbers, and the fact that disc drives are generally sealed when manufactured in better than class-10 clean rooms, many disc drives do not use adsorbers. Furthermore, users of disc drives rarely consider the impact of external environmental considerations, primarily due to the perceived robustness of a typical sealed disc drive.

Other types of storage devices and media which often are not perceived to be functionally at risk to these kinds of environmental concerns within the current state of technology. State of the art tape libraries, for example, may include sieve or mesh type filters designed to trap solid particulates or dust particles from air entering the library's environment. Yet ignoring the risk posed by environmental contaminants on such sensitive devices and media imperils valuable data stored thereon.

As described above, adsorbers can be used to filter air from airborne molecular contaminants and may be especially useful for preventing corrosion or contamination buildup on structures. It is to improvements related to this subject matter that the claimed invention is generally directed.

SUMMARY OF THE INVENTION

The present invention relates to conditioning an atmosphere for inside of a space dedicated for multiple storage devices and overcomes the disadvantages and limitations of the prior art by providing a method and apparatus for adsorbing gas borne molecules from gas for the inside of an enclosure containing multiple storage devices.

One embodiment of the present invention can therefore comprise a storage system comprising: an enclosure defining an interior volume of an interior gas and an exterior surface defining an exterior gaseous region; a plurality of data storage drive devices disposed in accommodating space within the enclosure wherein the data storage drive devices are adapted to functionally operate and are substantially surrounded by the interior gas; and at least one adsorbtive element disposed within the interior volume of the enclosure and capable of reducing any contaminants borne by the interior gas.

Other embodiments of the present invention may additionally comprise a method for reducing gas borne molecules for a storage system comprising: defining a space for a plurality of data storage drive devices wherein the data storage drive devices are adapted to functionally operate; controlling movement of gas from outside of the space to inside of the space; and adsorbing gas borne molecules from the gas for inside of the space.

Further embodiments of the present invention and also comprise a means for reducing gas-borne contaminants in a storage system comprising: means for defining a space adapted to contain a plurality of data storage drive devices; means for functionally operating the data storage drive devices; means for controlling gas transfer into the space; means for adsorbing gas borne molecules from the gas.

DETAILED DESCRIPTION

Figure 1:
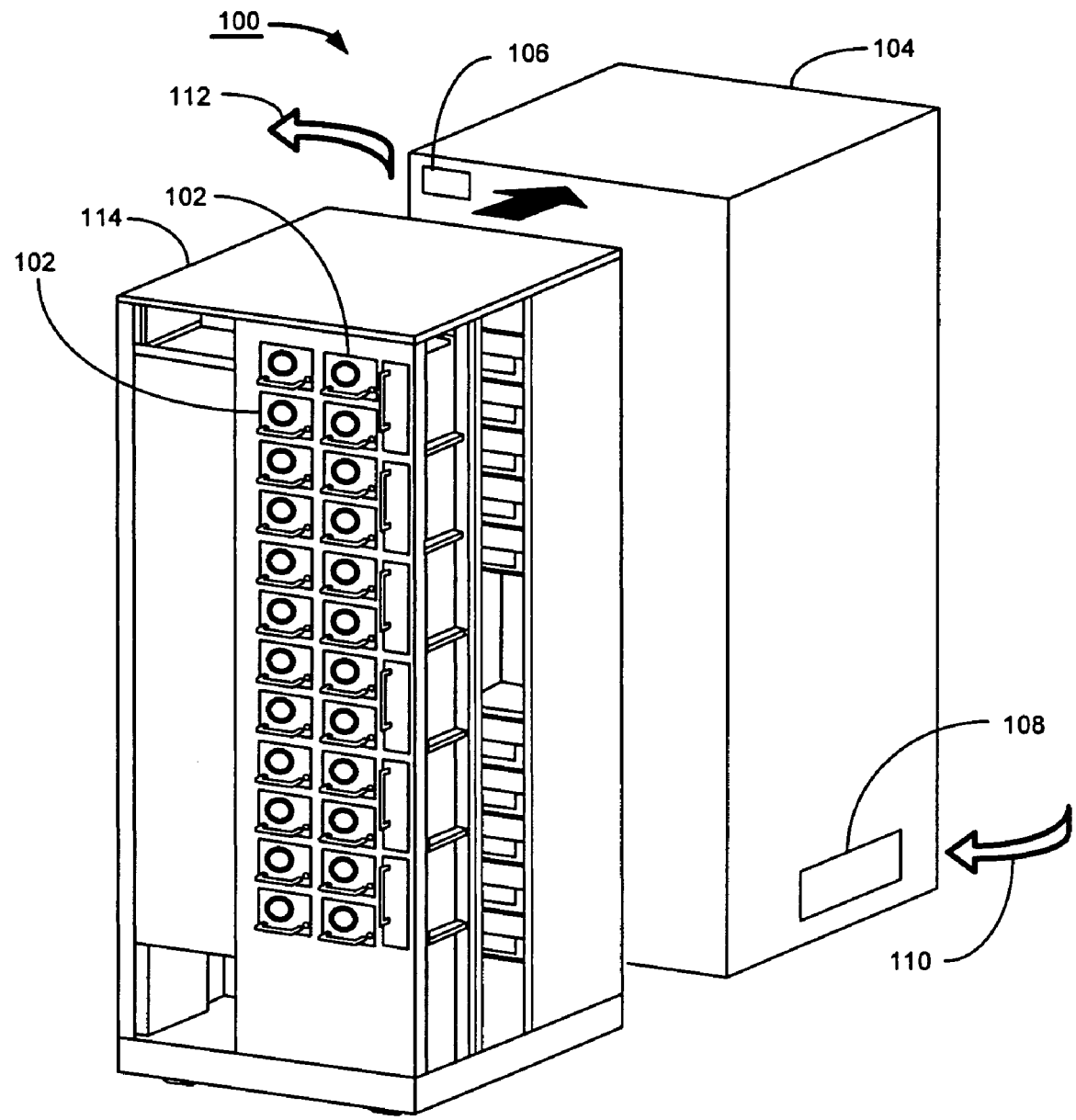
FIG. 1 is a perspective pictorial representation of a storage library intended to be disposed in an enclosure configured in an embodiment of the present invention.

While the claimed invention has utility in any number of different applications, FIG. 1 has been provided to illustrate a particularly suitable environment in which the claimed invention can be advantageously practiced. In what follows, similar or identical structure is identified using identical callouts.

In an embodiment of a storage system according to the present invention, FIG. 1 provides a perspective view of a storage library 100 which includes a plurality of data storage drive devices 102 intended to be disposed in an enclosure 104 configured to store and transfer data with a user or host. The enclosure 104 defines an interior volume substantially containing interior gas, which substantially surround the drive devices 102, at any given moment and an exterior surface defining an exterior gaseous region wherein the enclosure 104 interior has space or spaces to accommodate the storage drive devices 102. A storage drive device 102 is defined here as a drive system adapted to contain or to receive storage medium for reading and writing data. Examples of the storage medium could be, but are not limited to, magnetic storage means, such as magnetic discs or tape used in tape cassettes and disc drives which could further be used in disc drive packs, or magazines, containing multiple disc drives, optical data storage media (such as CDs, CD-RWs, DVD, DVD-Blue, etc.), and nanostorage media (i.e., media in which data are represented by differing states of nanoparticles) just to name a few. The combination of the enclosure 104 and internal data library constructions 114, which may include a variety of library components, for example storage drive devices 102, motors (not shown), cables (not shown), storage media, etc., in addition to structures supporting the components, are generally comprised in a storage library, such as storage library 100 commercially available from Spectra Logic Corporation of Boulder, Colo. A storage library user could be a person operating a computing system, whether in a location proximate to or remote from storage library 100, to read data from and/or store data to the storage library 100, for example. Alternatively, another example of a user is a computing system, or host, operating under instructions, such as a software program, to read from and/or write data to the storage library 100.

In one embodiment, the enclosure 104 could support an inlet opening 108, or port, for a gas, such as air, to flow in 110 and an outlet opening 106 for air to flow out 112 of the enclosure 104. As used herein, gas can include atmospheric air, purified air, or inert gases, all of which are subject to selection by a user of the storage library 100. Here, the illustrative embodiments are described in terms of atmospheric air, and could be considered standard ambient air comprising, among other things, oxygen, nitrogen, water vapor, dust, airborne acids, hydrocarbons, etc.

Figure 2A:
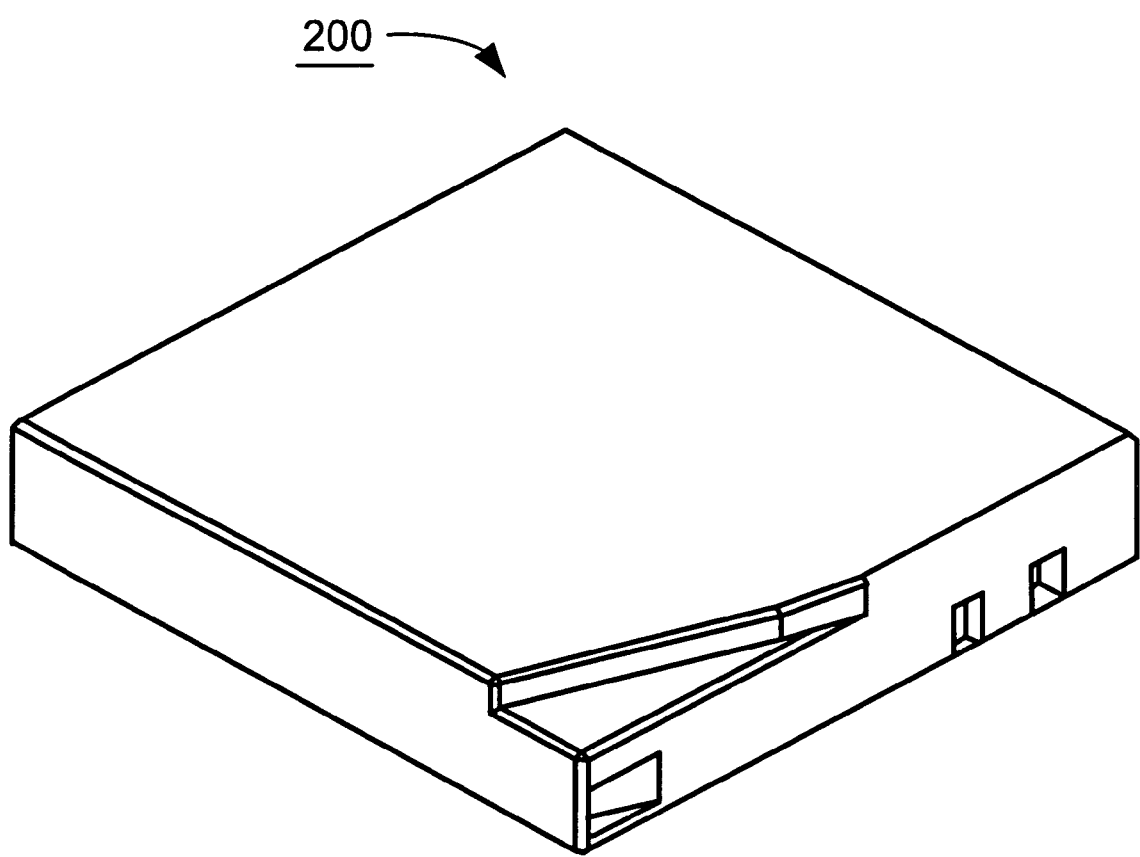
FIG. 2A is a pictorial representation of a digital tape cassette.
Figure 2B:
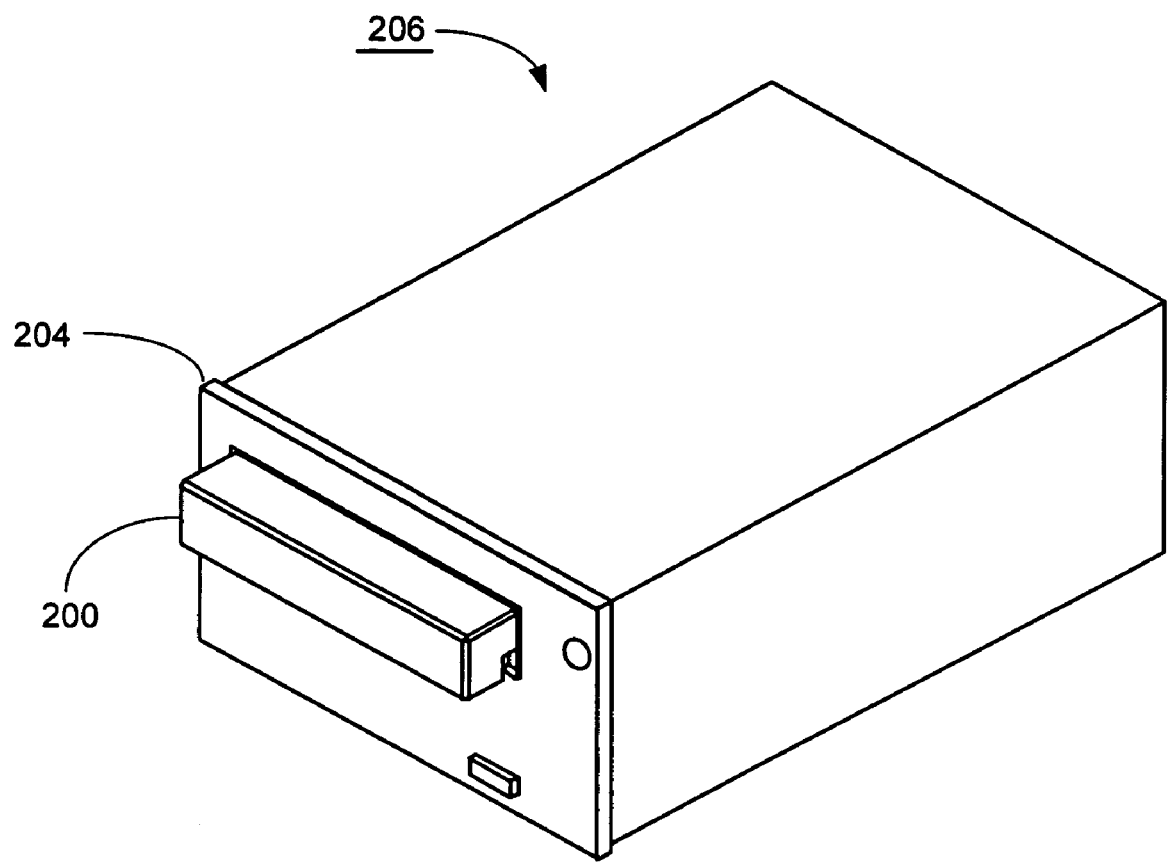
FIG. 2B is a pictorial representation of a tape drive accommodating a digital tape cassette.
Figure 2C:
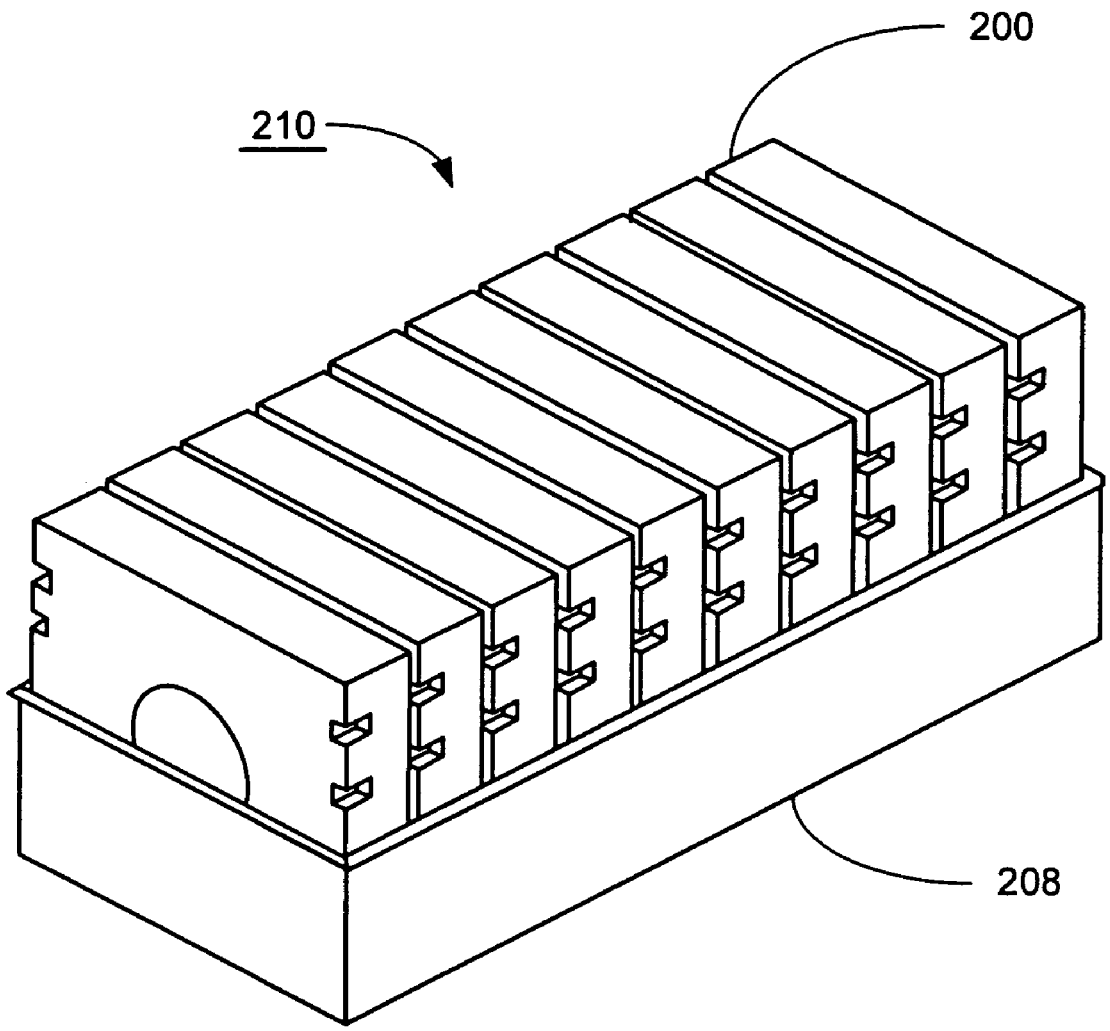
FIG. 2C is a pictorial representation of a tape media pack.

In accordance with some illustrative embodiments, the data storage library 100 could be a tape library, a library containing mobile disc drive magazine packs which could be configured as removable RAID (Redundant Array of Independent Discs [disc drives]) systems, a combination mobile disc drive magazine/tape library or a non removable RAID system, just to name a few. In the example of a tape library, such as storage library 100, a tape drive device 206 of FIG. 2B is adapted to cooperate with tape media substantially contained in a tape cassette, such as tape cassette 200 shown in FIG. 2A, for storing and retrieving data. In this example, the cassette 200 is received by an opening in the face 204 of the tape drive 206. In some tape libraries, a plurality of cassettes 200 are supported by a cassette magazine 208 in a media pack arrangement 210, as shown in FIG. 2C. A tape storage library, an embodiment of storage library 100, can generally accommodate a plurality of media packs 210 which are typically manipulated by robotic means (not shown) within the tape library. The robotic means for moving a tape cassette, such as 200, within a library, such as 100, in some cases have a grasping member, sometimes called a picker, adapted for grasping the tape cassette 200 from the magazine 208 and coupling the tape cassette 200 with the tape drive 206 for purposes of reading and writing. Reasons for moving media packs 210 in a tape library include facilitating reading and writing activities using multiple tape drives 206 cooperating with a single media pack 210 or multiple media packs 210 cooperating with a single tape drive 206, just to name two scenarios.

Figure 2D:
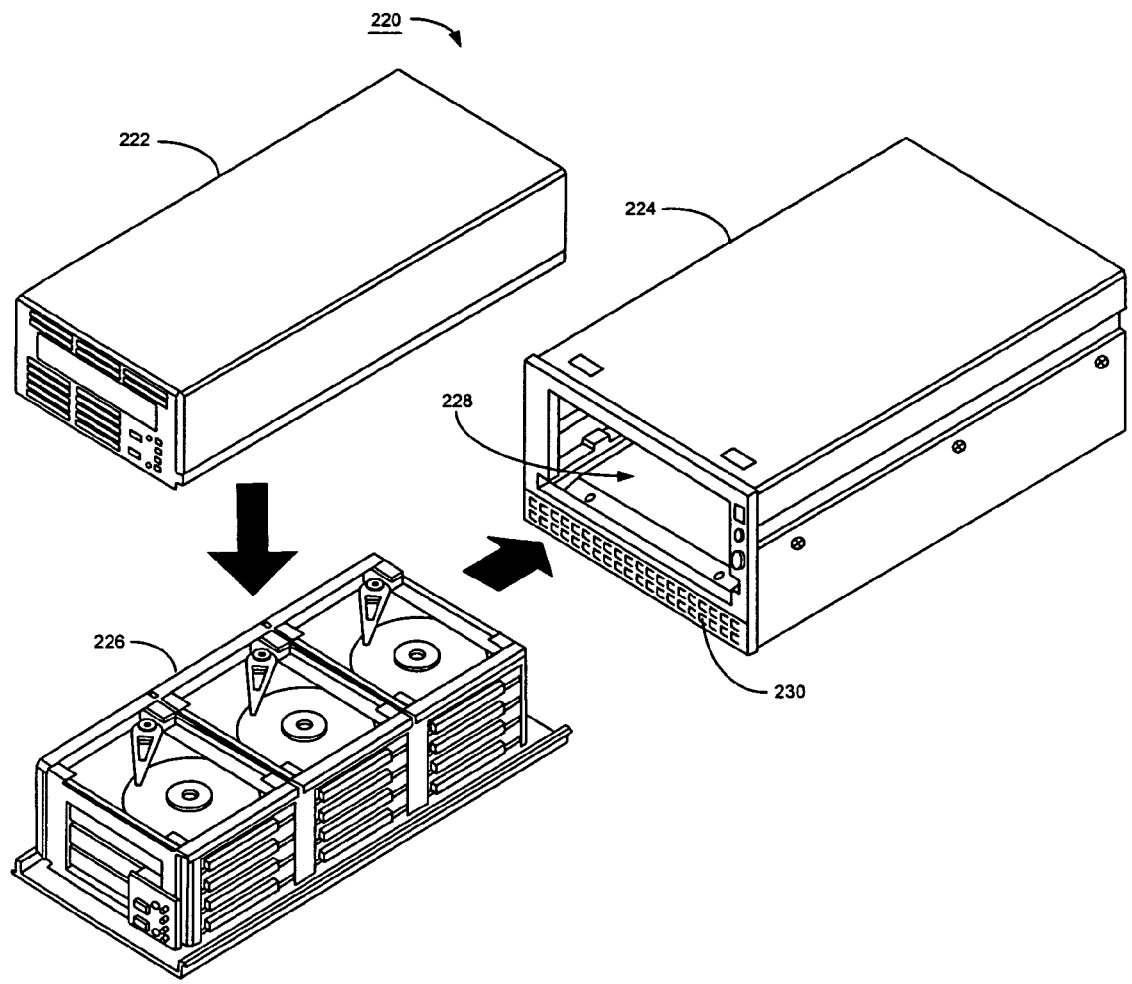
FIG. 2D is a pictorial representation of a mobile disc drive magazine and storage drive device.

As disclosed above, a storage library, such as 100, could comprise at least one mobile disc drive magazine pack 224 or a combination of a mobile disc drive magazine 224 and at least one tape drive 206, just to name two. FIG. 2D is an example of an embodiment of a mobile disc drive magazine system 220. Here, a plurality of disc drives 226 are substantially contained by an enclosure 222 generally comprising a mobile media pack and more specifically a mobile disc drive magazine. The mobile media pack, 222 and 226, is adapted to be received by an opening 228 in the mobile disc drive magazine drive device 224. The mobile disc drive magazine system 220 is adapted to operatively couple, or connect, with the rest of the library by a coupling means generally via the storage drive device 224, such as wires, wireless or plugs 230 for example. Further, if the geometry of the mobile disc drive magazine 222 and 226 is substantially the same as a cassette magazine, such as 210 of FIG. 2C, components and structures supporting the components in the library, such as 114 of FIG. 1, can serve both media packs efficiently.

Figure 3:
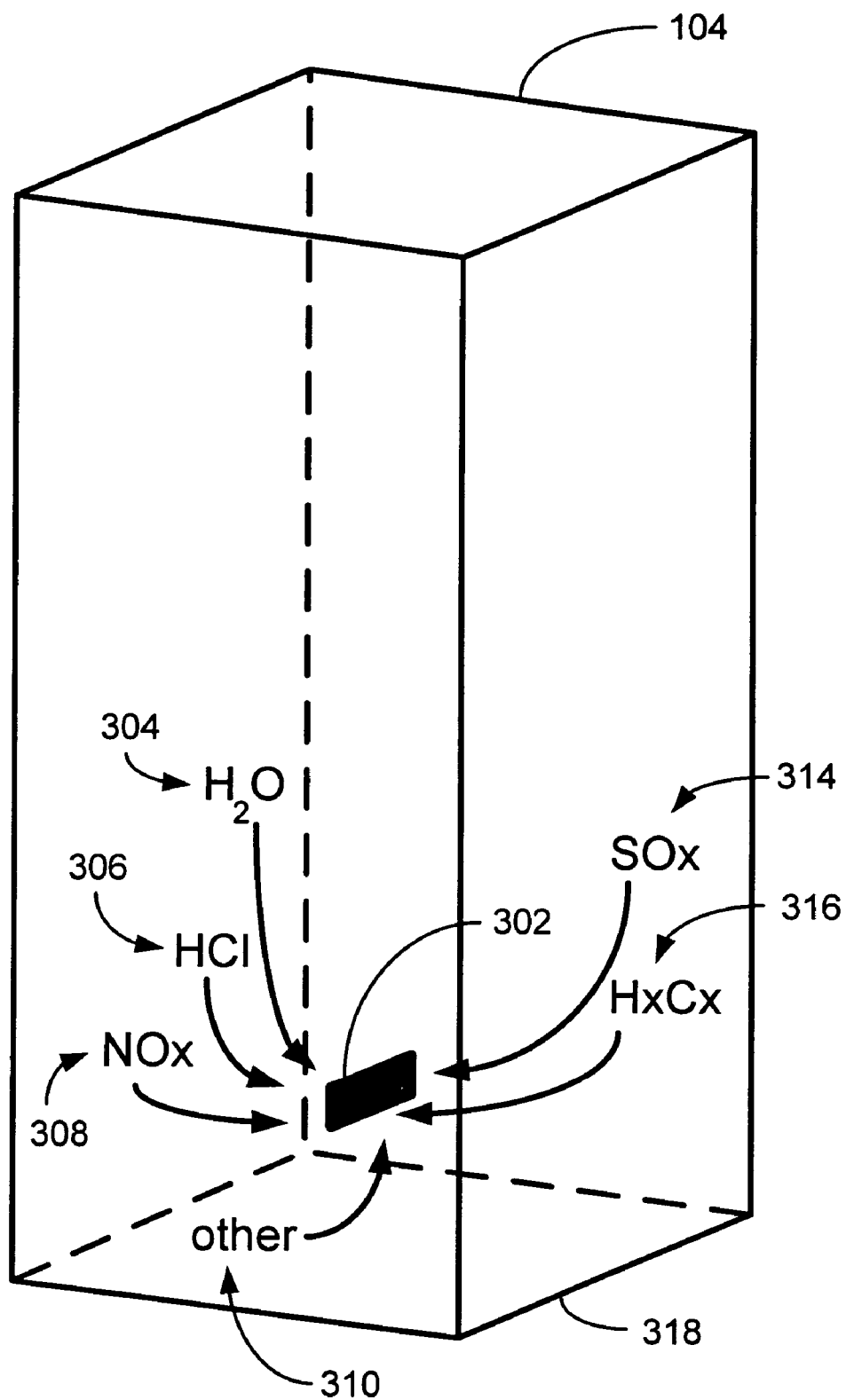
FIG. 3 is a pictorial representation of an adsorbtive element disposed in an enclosure configured in an embodiment of the present invention.

It will be understood that several sources may contribute to the contamination of the gas within the storage library 100. For example, contamination can occur at the point of manufacture of the storage library 100, during servicing of the storage library 100, or from the exchange of gas between the interior and exterior of the storage library 100 (whether through passive diffusive means or through active pushing, or moving, of the air through, for example, inlet and outlet ports). Contamination may also be introduced by the storage media itself. Thus, consistent with embodiments of the present invention, FIG. 3 shows the enclosure 104 for a storage system, such as the storage library 100 having an adsorbtive element 302 disposed within the enclosure 104. This embodiment is illustrative of an enclosure not having openings, or ports, for air to flow, such as 106 and 108 of FIG. 1, however openings could exist on an alternate embodiment of FIG. 3. The adsorbtive element 302 could be supported by a supporting means, such as a bracket for example, or adhesive whereby one surface of the adsorbtive element 302 could be adhered to an internal surface of the enclosure 104. In an alternative embodiment, the adsorbtive element 302 could be resting on a surface inside of the enclosure 104, for example lying on the bottom surface 318 of the enclosure 104 due to gravity. In this embodiment, the adsorbtive element 302 is capable of attracting and adsorbing gas borne molecules that could be present in ambient air defined by the space inside, or space within, the enclosure 104. As illustrated here, the adsorbtive element 302 is capable of adsorbing gas borne molecules which could comprise water vapor 304, hydrocarbons 316, airborne acids, such as hydrochloric acids 306, nitric acids 306, sulfuric acids 314, and other molecules 310. Examples of adsorbtive elements include activated carbon, silica gel, ion exchange membranes, liquid based adsorbers, etc. The adsobtive element 302 is selected and sized based upon a number of factors, such as the cost of the adsorber material, the degree to which contaminant particles are desired to be removed from gas within the storage library 100, and the flow characteristics of gas within the storage library 100, i.e., whether or not gas is actively moved through the storage library 100.

Though one or more adsorbtive elements could be used in a variety of applications consistent with the invention, a commercial example illustrating an embodiment of the present invention is the use of an activated carbon adsorber for a Spectra Logic Python tape library. The Python tape library is generally comprised of a plurality of tape drives capable of reading and writing to DLT (Digital Linear Tape) standard sized tape cassettes from Quantum Corporation headquartered in Irvine, Calif. The tape drives and tapes are substantially contained in a metal cabinet. The Python tape library has air inlet and outlet ports in the cabinet where air is forced through the library by a plurality of fans. Hence, the volume of air in the library is approximately 30 cubic feet and the projected air exchange is 20 exchanges per hour. The target airborne contaminants affecting performance of the drive components and media are hydrocarbons and airborne acids which are adsorbed reasonably well by activated carbon adsorbers. 30 grams of activated carbon adsorber from WL Gore and Associates Corporation located in Newark, Del. could be dispersed on the inside surface of a course 16×24×⅝ inch Gore particulate filter substantially fitting the intake port in the library enclosure. The filter and adsorber system could be changed every 90 days for optimum performance.

Figure 4:
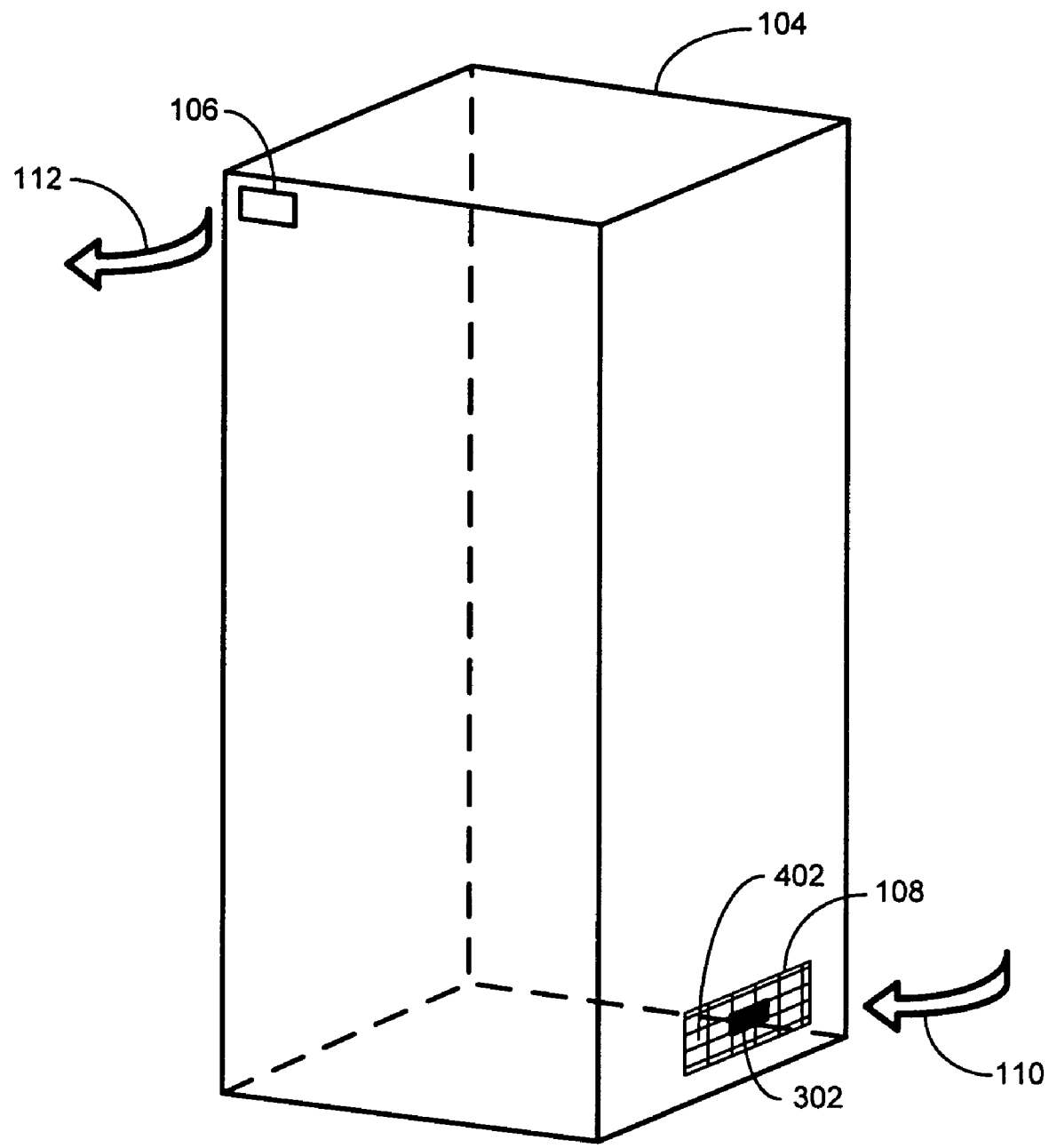
FIG. 4 is a pictorial representation of an adsorbtive element disposed at an inlet of an enclosure in a path of air intake and supported by a supporting means in accordance with an embodiment of the present invention.

FIG. 4 shows an embodiment of the present invention wherein the adsorbtive element 302 is disposed in inlet port 108 of the enclosure 104 in the path of air intake 110 and supported by a support means, such as a screen 402 for example. The outlet port 106 can facilitate a path for air to flow out 112 of the enclosure 104.

Figure 5:
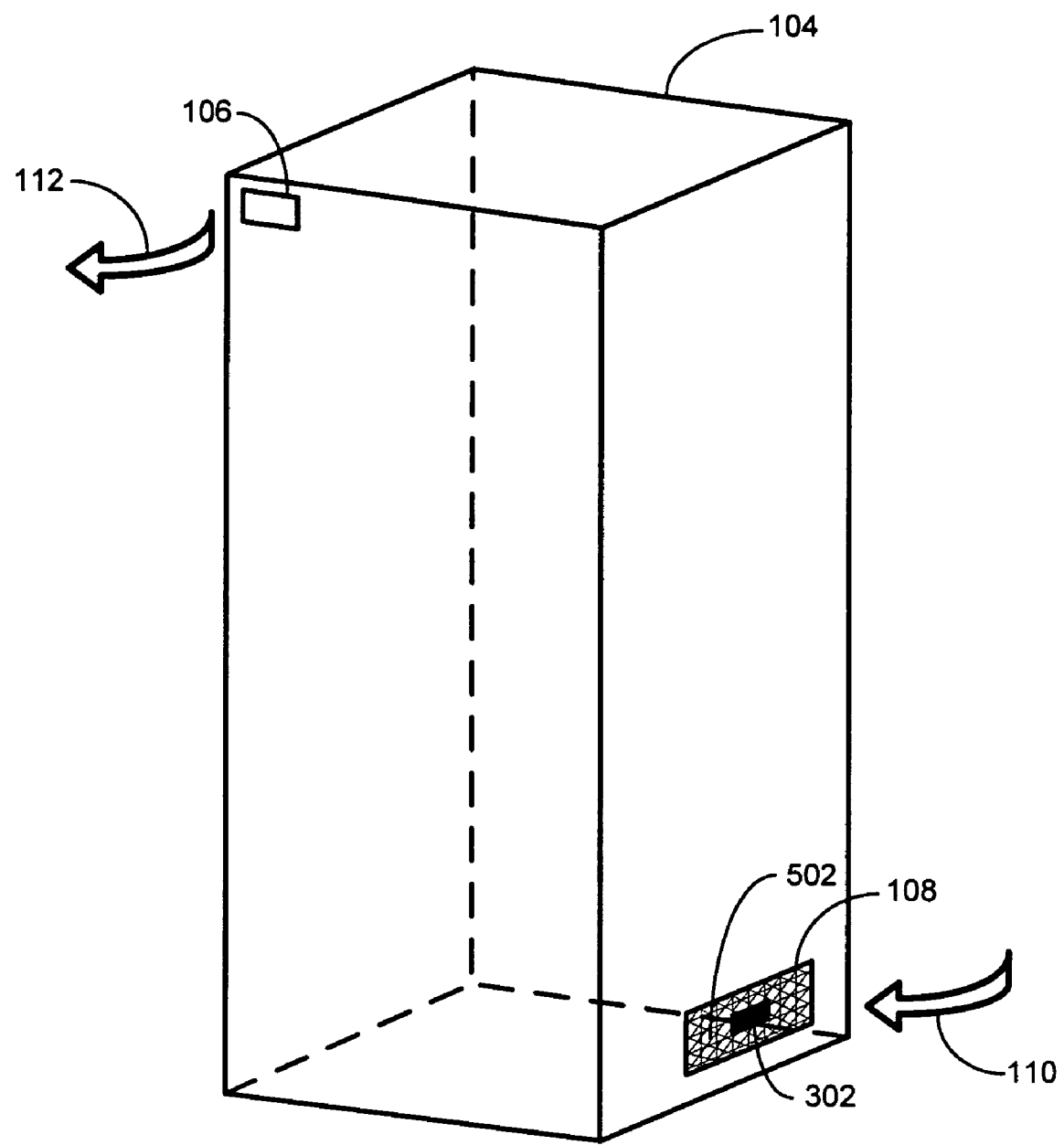
FIG. 5 is a pictorial representation of an adsorbtive element disposed at an inlet of an enclosure in a path of air intake in combination with a particulate filtration element in accordance with an embodiment of the present invention.

FIG. 5 shows an embodiment of the present invention wherein the adsorbtive element 302 is combined with a particulate filtration element 502 disposed proximate to the inlet port 108 of the enclosure 104. Here, the adsorbtive element 302 and the particulate filtration element 502 are disposed in the path of air intake 10 whereby the outlet port 106 can facilitate a path for air, or gas, to exit 112 the enclosure 104. A particulate filtration element 502 is generally used for capturing particles, such as dust, and could be a simple fiberglass mesh, a HEPA (High Efficiency Particulate Air) filter, an ULPA (Ultra Low Penetrating Air) filter, an electrostatic filter, an ion filter, just to name a few examples.

Figure 6:
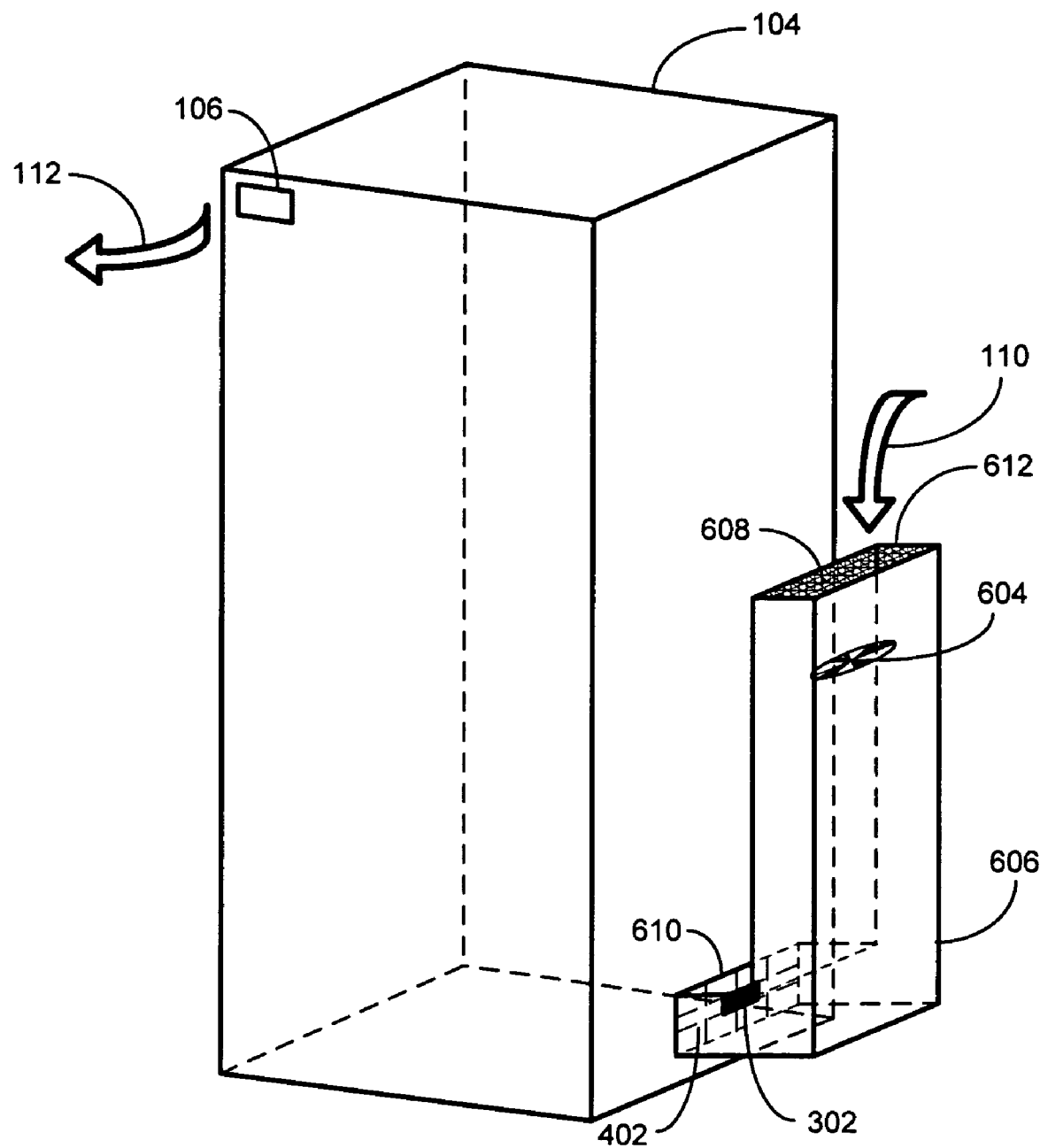
FIG. 6 is a pictorial representation of an adsorbtive element disposed in a path of air in an enclosure comprising a conduit having an inlet for air intake, a force air flow means and a particulate filtration element in accordance with an embodiment of the present invention.

In accordance with other preferred embodiments, FIG. 6 shows an enclosure for a storage system, such as 100, which could comprise conduit 606 that cooperates with the enclosure 104 to form a duct-like pathway for exterior air to flow 110 from an exterior gaseous region into the interior region of the enclosure 104. Here, the conduit 606 comprises and inlet location 612, whereby external air can flow 110 into the conduit 606, and an outlet location 610 whereby the air passing through the conduit 606 can flow into the enclosure 104. The conduit 606 could also comprise a means for moving air between the outside and inside of the enclosure 104 and conduit 606 to facilitate the movement of air 110 into the enclosure 104 in order to replenish the air in the enclosure 104. Means for moving air between the exterior gaseous region and the interior volume of the enclosure 104 including the conduit 606 could be accomplished with a fan 604 for example and though shown as disposed within the conduit 606 is not limited to being disposed within the conduit 606. The outlet port 106 can facilitate a path for air to flow out 112 of the enclosure 104. FIG. 6 also shows a particulate filtration element 608, or simply a particulate filter in this case, at the inlet portion 612 of the conduit 606 and the exterior gaseous region 302 disposed on a supporting member 402 at the outlet location 610 of the conduit 606. Both the particulate filtration element 612 and the adsorbtive element 302 are in the path of the intake air flow 110.

Figure 7:
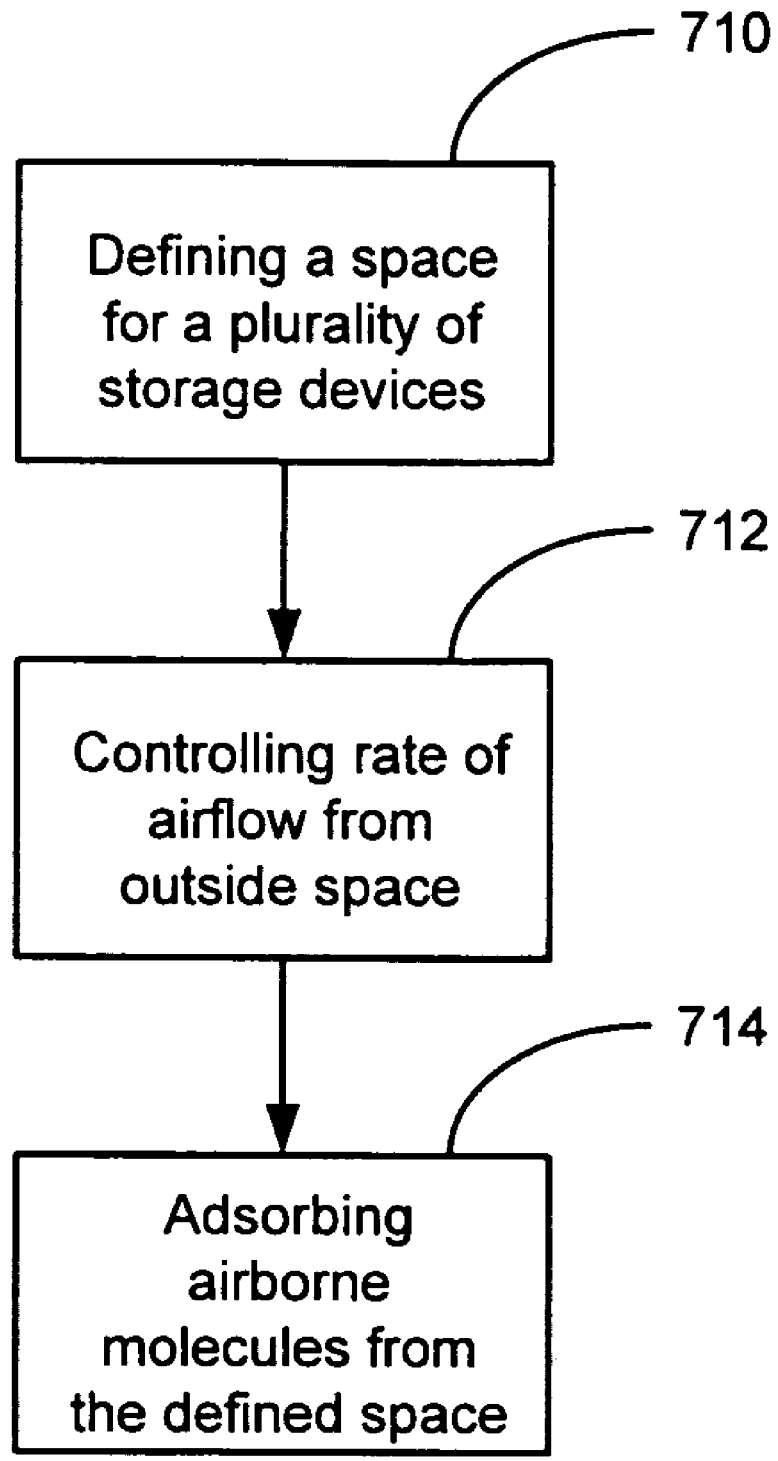
FIG. 7 shows a flow diagram of a method for adsorbing airborne molecules for a storage system in accordance with an embodiment of the present invention.

Referring now to FIG. 7, shown therein is a method for adsorbing airborne molecules for a storage system, such as 100. It should be recognized that the steps presented here do not require this or any particular order or sequence. In step 710, a space is defined to accommodate a plurality of storage devices, such as 102, wherein the data storage devices are adapted to functionally operate, i.e. read and write data and functionally cooperate with a user or host. The defined space could be, but is not limited to, an enclosure, such as 104 or 222 for example. Step 712 is a gas movement controlling step wherein the gas movement, or air flow for example, could have a flow rate that could be controlled from the outside of the defined space to the inside of the defined space. The movement of air could be controlled to be substantially zero, for example an enclosure such as 104 of FIG. 3 not having openings such as 106 and 108 shown in FIG. 1. In another embodiment, the movement of gas could be controlled to having a finite flow rate either generated by free flow, which can be caused by convection, or alternatively by a forced flow means, such as the fan 604 of FIG. 6. In step 714, airborne molecules are adsorbed from the air for inside of the defined space. The adsorption step, 714, could be accomplished with an adsorbtive element, such as 302.

Figure 8:
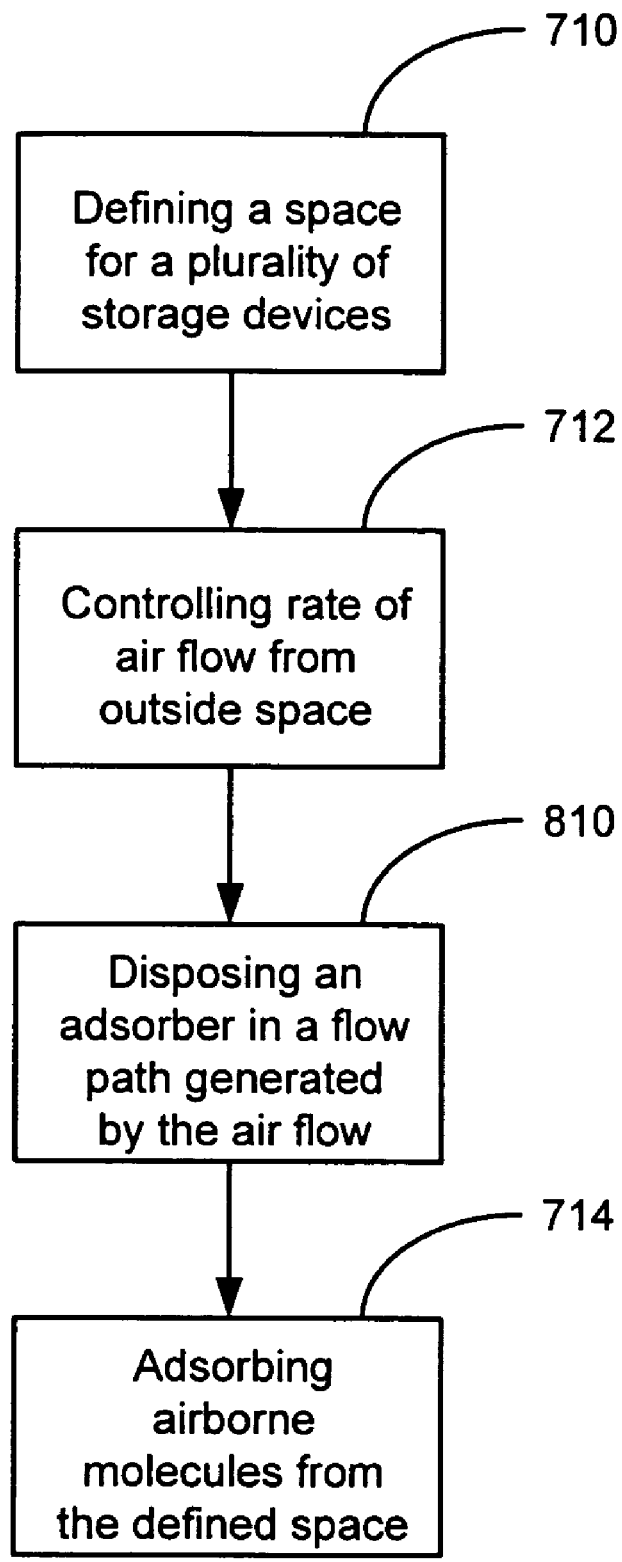
FIG. 8 shows an alternative embodiment of FIG. 7 wherein an adsorbtive element is disposed in a path generated by a flow of air.

FIG. 8 is an alternative embodiment of the present invention which includes method steps 710, 712 and 714 from FIG. 7. In step 810, an adsorbtive element, such as 302, could be disposed in a path generated by the movement of air when the rate of air flow 712 is controlled to have a finite flow rate, or a flow rate that is not substantially zero.

It is to be understood that even though numerous characteristics and advantages of various embodiments of the present invention have been set forth in the foregoing description, together with the details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular geometry supporting adsorbtive elements and storage systems while maintaining substantially the same functionality without departing from the scope and spirit of the present invention. This may be exemplified by the adsorbtive elements, such as 302 of FIG. 3, having distinct purposes or distinct parts combined to having distinct purposes or wherein multiple adsorbtive elements are enclosed in and enclosure, such as 104 of FIG. 1. In addition, although the preferred embodiments described herein are directed to storage libraries and related technology, it will be appreciated by those skilled in the art that the teachings of the present invention can be applied to other systems, such as the mobile disc drive magazine 222 and 226 of FIG. 2D, without departing from the spirit and scope of the present invention.

It will be clear that the present invention is well adapted to attain the ends and advantages mentioned as well as those inherent therein. While presently preferred embodiments have been described for purposes of this disclosure, numerous changes may be made which readily suggest themselves to those skilled in the art and which are encompassed in the spirit of the invention disclosed and as defined in the appended claims.

What is claimed is:

1. A data storage system comprising:
   an enclosure defining an interior volume of an interior gas and an exterior surface defining an exterior gaseous region;
   a plurality of data storage drive devices disposed in accommodating space within the enclosure wherein the data storage drive devices are adapted to functionally operate and are substantially surrounded by the interior gas; and
   at least one adsorbtive element disposed within the interior volume of the enclosure and capable of reducing any contaminants borne by the interior gas.

2. The data storage system of claim 1, wherein the interior gas is a gas selected from the group of gases consisting of: atmospheric air, purified air, and inert gas.

3. The data storage system of claim 1, wherein the enclosure comprises at least one port.

4. The data storage system of claim 3, wherein the at least one port is an inlet port.

5. The data storage system of claim 3, wherein the at least one port is an outlet port.

6. The data storage system of claim 3, wherein the enclosure comprises at least one inlet port and one outlet port capable of generating a path for gas from the exterior gaseous region to flow through the enclosure.

7. The data storage system of claim 6, wherein the adsorbtive element is disposed in the path of the gas.

8. The data storage system of claim 3, further comprising a means for moving gas between the interior volume and the exterior gaseous region.

9. The data storage system of claim 3, wherein a particulate filtration element is disposed proximate to the at least one port.

10. The data storage system of claim 3, wherein a particulate filtration element in combination with the adsorbtive element is disposed proximate to the at least one port.

11. The data storage system of claim 3, wherein the at least one port is comprised of a conduit.

12. The data storage system of claim 1, wherein the contaminants are selected from the group of contaminants consisting of: airborne acids, hydrocarbons, and water vapor.

13. A method for reducing gas borne molecules for a storage system comprising:
    defining a space for a plurality of data storage drive devices wherein the data storage drive devices are adapted to functionally operate;
    controlling movement of gas from outside of the space to inside of the space; and
    adsorbing gas borne molecules from the gas for inside of the space.

14. The method of claim 13 wherein the adsorbing step is accomplished with an adsorbtive element.

15. The method of claim 13 wherein the movement of gas in the controlling step is substantially zero.

16. The method of claim 14 further comprising disposing the adsorbtive element in a flow path generated by the movement of gas when controlled to have a finite flow rate.

17. The method of claim 14 further comprising disposing the adsorbtive element coupled with a particulate filtration element in a flow path generated by the movement of gas when controlled to have a finite flow rate.

18. A storage system comprising:
    means for defining a space adapted to contain a plurality of data storage drive devices;
    means for functionally operating the data storage drive devices;
    means for controlling gas transfer into the space;
    means for adsorbing gas borne molecules from the gas.

19. The storage system of claim 18 further comprising means for filtering particles suspended in the gas.

20. The storage system of claim 18 further comprising means for circulating gas within the space.

* * * * *